United States Patent
San Andres et al.

(10) Patent No.: US 8,963,557 B2
(45) Date of Patent: Feb. 24, 2015

(54) SYSTEMS, METHODS, AND APPARATUS FOR LOCATING POSSIBLE FAULT LOCATIONS IN AN ELECTRICAL POWER NETWORK

(75) Inventors: Ramon Juan San Andres, Atlanta, GA (US); Blaine Madison Mucklow, Atlanta, GA (US); Shitanshu Srivastava, Atlanta, GA (US)

(73) Assignee: General Electric Company, Schenectady, NY (US)

( * ) Notice: Subject to any disclaimer, the term of this patent is extended or adjusted under 35 U.S.C. 154(b) by 522 days.

(21) Appl. No.: 13/226,084

(22) Filed: Sep. 6, 2011

(65) Prior Publication Data
US 2013/0057296 A1 Mar. 7, 2013

(51) Int. Cl.
*G01R 31/08* (2006.01)

(52) U.S. Cl.
CPC ............ *G01R 31/086* (2013.01); *G01R 31/088* (2013.01); *Y04S 10/522* (2013.01)
USPC ........................................................ 324/525

(58) Field of Classification Search
CPC ..... G01R 31/08; G01R 31/085; G01R 31/086
USPC ........................................................ 324/525
See application file for complete search history.

(56) References Cited

U.S. PATENT DOCUMENTS

| | | | |
|---|---|---|---|
| 4,321,681 A * | 3/1982 | Sackin et al. | 700/293 |
| 4,544,807 A * | 10/1985 | Sers | 379/27.08 |
| 6,917,888 B2 | 7/2005 | Logvinov et al. | |
| 7,560,935 B2 * | 7/2009 | Morimoto | 324/525 |
| 7,728,600 B2 * | 6/2010 | Wahlroos et al. | 324/509 |
| 2008/0158750 A1 * | 7/2008 | Premerlani et al. | 361/63 |
| 2009/0147415 A1 | 6/2009 | Lazarovich et al. | |

* cited by examiner

*Primary Examiner* — Jeff Natalini
(74) *Attorney, Agent, or Firm* — Sutherland Asbill & Brennan LLP

(57) ABSTRACT

Certain embodiments of the invention may include systems, methods, and apparatus for locating possible fault locations in an electrical power network. According to an example embodiment of the invention, a method is provided for locating possible fault locations in an electrical power network. The method can include receiving fault information including one or more of: an identifier associated with at least one tripping device or a fault impedance value associated with a faulted section of the electrical power network; determining a fault direction; and generating a list of possible fault locations based at least in part on the received fault information and the fault direction.

20 Claims, 4 Drawing Sheets

US 8,963,557 B2

SYSTEMS, METHODS, AND APPARATUS FOR LOCATING POSSIBLE FAULT LOCATIONS IN AN ELECTRICAL POWER NETWORK

FIELD OF THE INVENTION

This invention generally relates to electrical power networks, and in particular, to locating faults in the network.

BACKGROUND OF THE INVENTION

In an electric power system, a fault may be considered as any abnormal flow of electric current. Faults can include short circuits and open circuits. In three-phase systems, a fault may involve one or more phases and ground, or may occur only between phases. Electrical power systems typically utilize circuit breakers and other protective devices to limit current in the event of a short circuit failure. When a fault occurs in a power system, fault detection, isolation and restoration (FDIR) systems can be used to provide certain information. However, in many circumstances, the location of a fault cannot be pinpointed with absolute certainty, and restoration of electrical power can be delayed because of incomplete fault location information.

BRIEF SUMMARY OF THE INVENTION

Some or all of the above needs may be addressed by certain embodiments of the invention. Certain embodiments of the invention may include systems, methods, and apparatus for locating possible fault locations in an electrical power network.

According to an example embodiment of the invention, a method is provided for locating possible fault locations in an electrical power network. The method can include receiving fault information including one or more of: an identifier associated with at least one tripping device or a fault impedance value associated with a faulted section of the electrical power network; determining a fault direction; and generating a list of possible fault locations based at least in part on the received fault information and the fault direction.

According to another example embodiment, a system is provided. The system includes at least one tripping device and a fault location engine configured for receiving fault information. The fault information can include one or more of an identifier associated with the at least one tripping device or a fault impedance value associated with a faulted section of an electrical power network. The fault location engine is also configured for determining a fault direction and generating a list of possible fault locations based at least in part on the received fault information and the fault direction.

According to another example embodiment, an apparatus is provided. The apparatus includes a fault location engine configured for receiving fault information. The fault information can include one or more of an identifier associated with the at least one tripping device or a fault impedance value associated with a faulted section of an electrical power network. The fault location engine is also configured for determining a fault direction and generating a list of possible fault locations based at least in part on the received fault information and the fault direction.

Other embodiments and aspects of the invention are described in detail herein and are considered a part of the claimed inventions. Other embodiments and aspects can be understood with reference to the following detailed description, accompanying drawings, and claims.

BRIEF DESCRIPTION OF THE FIGURES

Reference will now be made to the accompanying tables and drawings, which are not necessarily drawn to scale, and wherein.

DETAILED DESCRIPTION OF THE INVENTION

Embodiments of the invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Certain embodiments of the invention may enable locating a fault in an electric power network. When a fault occurs in an electric power circuit, one of the first steps in a FDIR (fault detection, isolation and restoration) service is the identification of the fault location. Given the information available, it may not be possible to pinpoint the exact fault location. Instead of the single actual fault location, a list of possible locations may be the best that the real-time information may allow. Example embodiments of the invention provide systems, methods, and apparatus for generating a list of possible fault locations.

According to certain example embodiments of the invention, two different methodologies may be utilized to determine different possible fault locations: one method is based on fault indicator measurements, and the other method is based on impedance values. Possible fault location information may be used by the FDIR system to generate isolation and restoration plans for each of the possible identified locations. According to an example embodiment, a list may be generated with all possible fault locations along with information indicating what method was used to calculate each location. In example embodiments, isolation and restoration plans may be generated for the identified possible fault locations. In an example embodiment, an operator can use the generated information (and any other information available) to select the appropriate isolation and restoration plan to execute.

Various components may be utilized for determining possible fault locations, according to example embodiments of the invention, and will now be described with reference to the accompanying figures.

Figure 1:
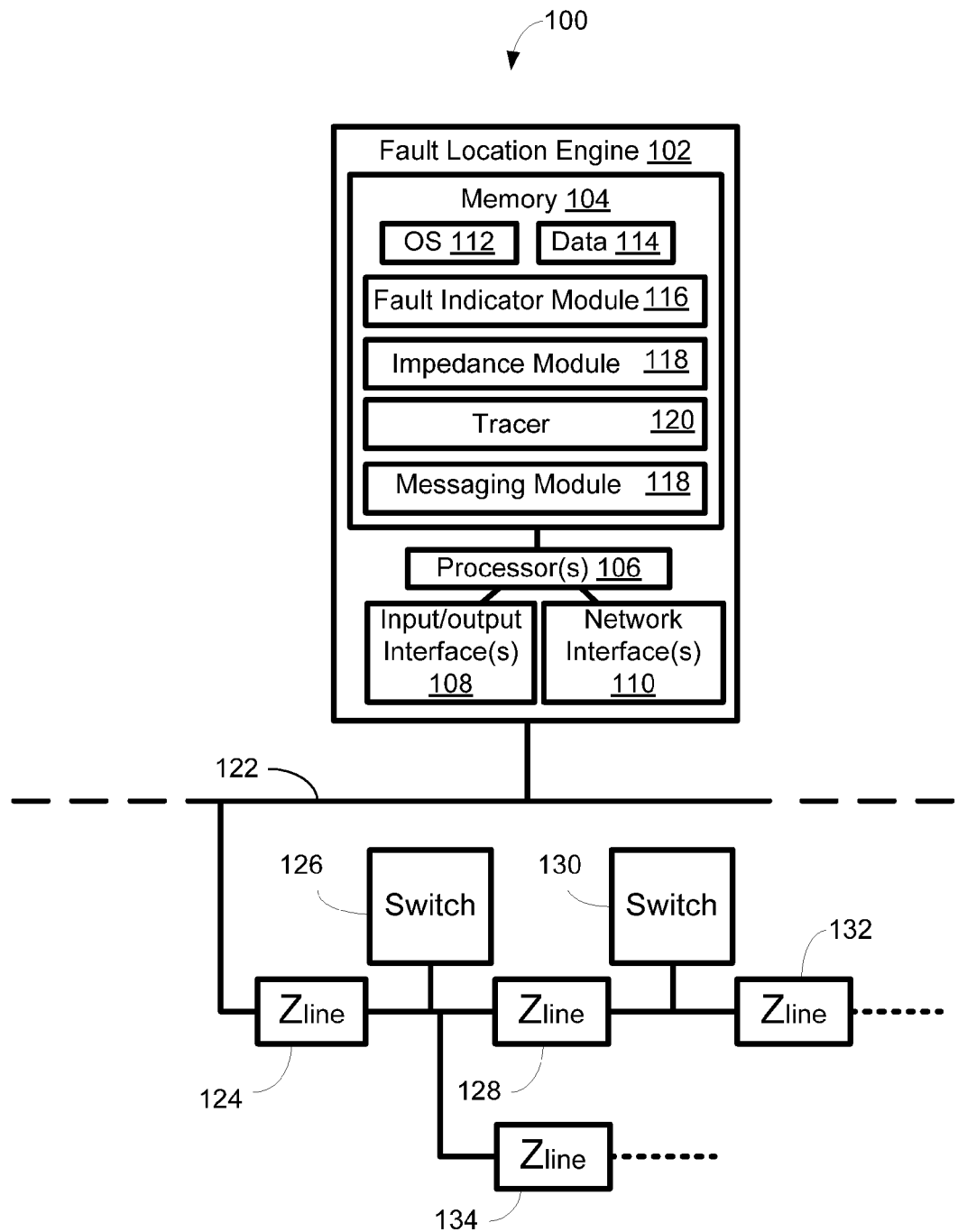
FIG. 1 is a block diagram of an illustrative fault location system, according to an example embodiment of the invention.

FIG. 1 illustrates an example fault location system 100, according to an example embodiment of the invention. In an example embodiment, the system 100 may be utilized to monitor a power network 122. In an example embodiment, the power network 122 may include line segments and branches with associated line impedance values 124, 128, 132, 134. In example embodiments, switches tripping devices 126, 130 may be included at various points in the network. For example, switches tripping devices 126, 130 may be utilized to isolate and/or disconnect a faulted section of the network 122 so that power can be provided to other parts of the network 122.

According to an example embodiment of the invention, a fault location engine 102 may be in communication with the network 122, and may be utilized to determine possible fault locations in the network 122. In an example embodiment, the fault location engine 102 may include a memory 104, one or more processors 106, one or more input/output interfaces 108, and/or one or more network interfaces 110. In an example embodiment, the memory 104 may include an operating system 112, data 114, and machine-readable code modules. For example, the memory 104 may include a fault indicator module 116, which may interpret the information received from switches tripping devices 126, 130 or other devices associated with the network 122, and the fault indicator module 116 may provide an indication that a fault has occurred.

According to an example embodiment, the memory 104 may also include an impedance module 118 that may be utilized to determine a fault location based on available impedance information, if any. For example, in certain cases, switches tripping devices 126, 130 associated with the power network 122 may be configured to measure the line impedance values 124, 128, 132, 134 and provide the information to the fault location engine 102 via an advanced meter infrastructure (AMI) communications channel, or via other communications channels.

According to an example embodiment, the memory 104 may also include a tracer module 120 that may be utilized for determining possible fault locations by tracing through a virtual map of the network. For example, the plurality of network switches or tripping devices (as in 126, 130) may report their status to the fault location engine 102. In an example embodiment, the received information may be utilized by the tracer module 120 to determine possible faulted sections. According to example embodiments, the tracer module 120 may also be utilized for devising a restoration plan based on the received information and input criteria for prioritizing restoration. In an example embodiment, the fault location engine 102 may also include a messaging module 118 that may provide information to personnel regarding a fault, possible fault locations, and/or a restoration plan.

Figure 2:
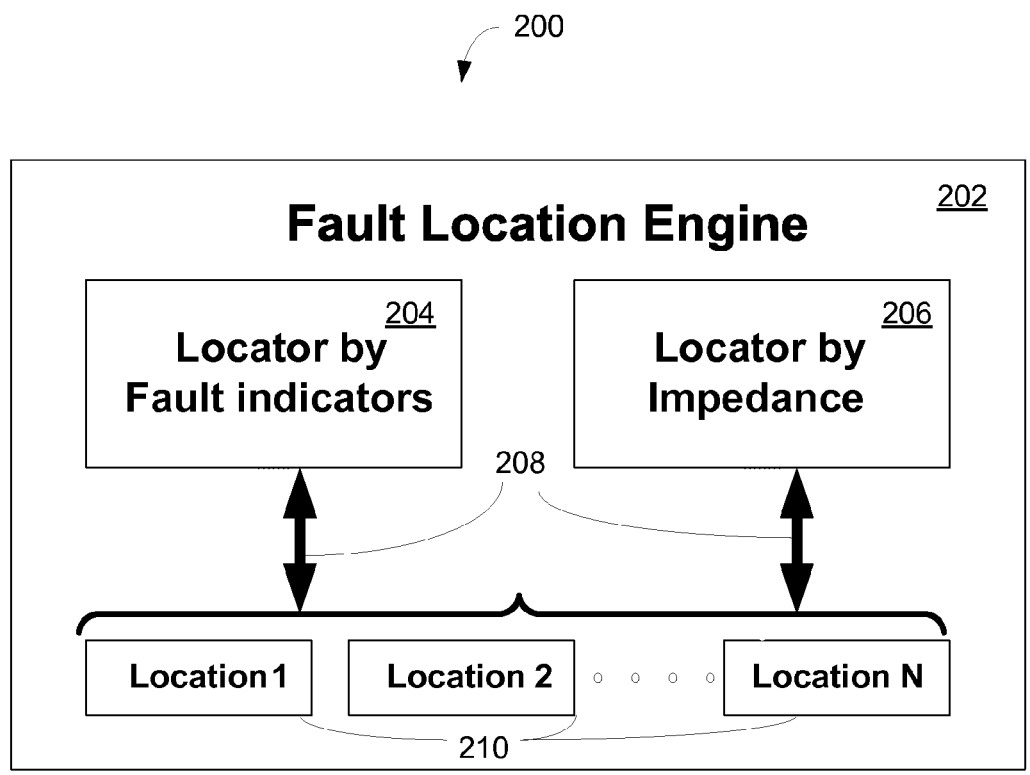
FIG. 2 is a block diagram of an illustrative fault location engine, according to an example embodiment of the invention.

FIG. 2 depicts another example embodiment of a fault location engine 202. In an example embodiment, the various locations 210 within the power network may be evaluated 208 by two different location methods. In one example method, the locations 210 representing tripping devices, may be evaluated 208 by a fault indicator engine 204, which may receive fault indicators and determine the possible fault locations based on the received fault indicators. In another example method, the locations 210 may be evaluated 208 by an impedance engine 206. Each sub-engine 204, 206 is an independent module and can be executed in parallel.

According to an example embodiment, the sub-engines 204, 206 may receive information including the identity of the tripping device (the unique identifier of a power breaker). According to an example embodiment, the sub-engines 204, 206 may also receive information including the identity of the tripping device energization information, identifying what side of the breaker is energized and which side is not. Such information may be used to determine the direction in which the fault occurred. According to an example embodiment, the sub-engines 204, 206 may also receive a fault indicator, which may or may not be present. If the fault indicator measurement is not present, a default value may be assumed by the locator by fault indicators sub-engine. According to an example embodiment, the sub-engines 204, 206 may also receive a fault impedance, which may or may not be present. If the fault impedance measurement is not present, location by impedance is not attempted. If this measurement is present, the locator by impedance is invoked via the impedance engine 206.

According to example embodiments, both sub-engines 204, 206 may trace the circuit starting at the tripping device using a standard objective-based tracer provided by the FDIR system. According to an example embodiment, each sub-engine 204, 206 may have its own tracing objective based on separate tracing parameters. According to an example embodiment, each of the possible locations identified by the location sub-engines 204, 206 are added to a common list of location alternatives. This list may be used by a splitter Enterprise Integration Pattern within the FDIR system to send messages to instances of the FDIR Fault Isolation Engine.

Figure 3:
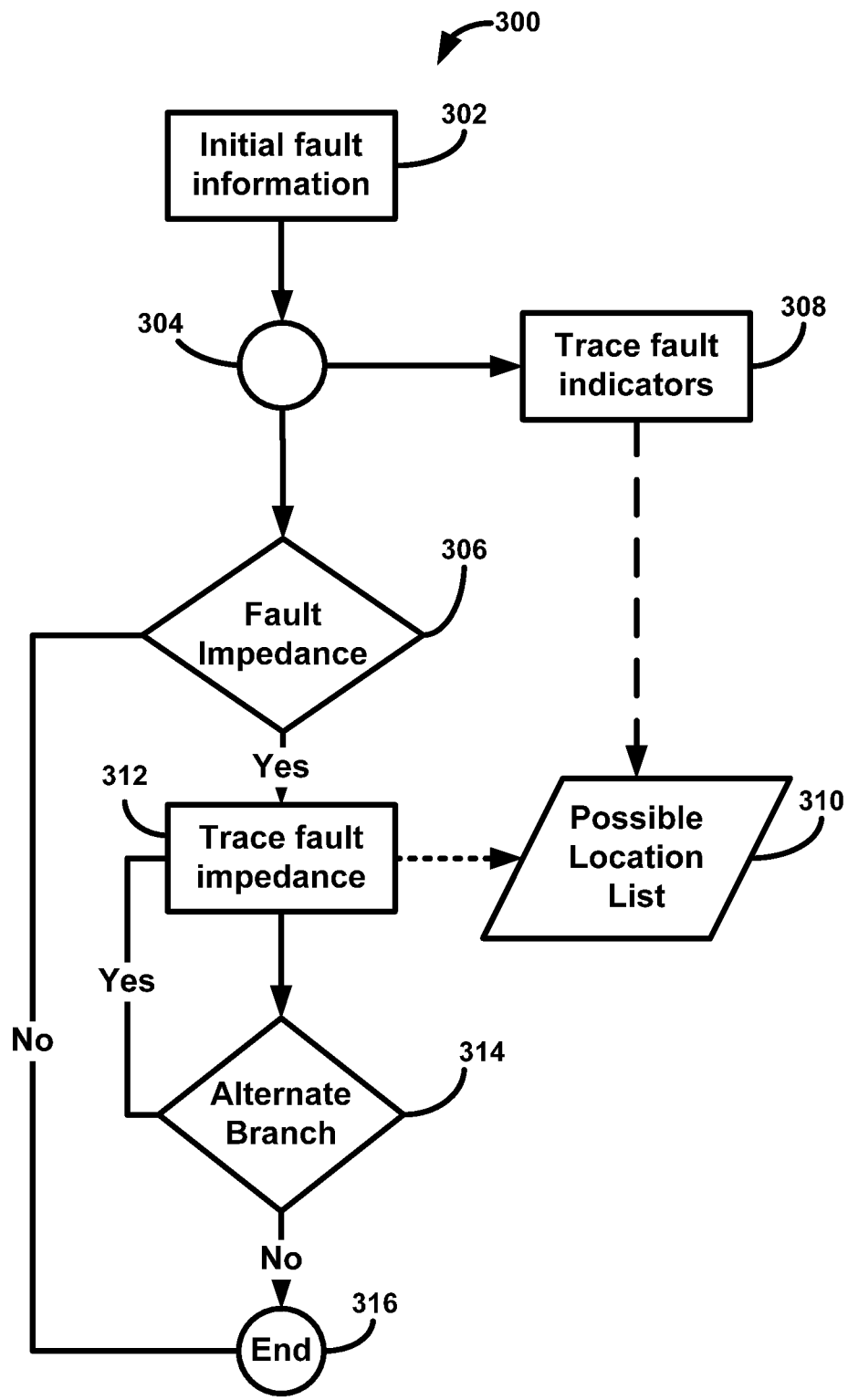
FIG. 3 is a fault finding procedural sequence, according to an example embodiment of the invention.

FIG. 3 shows an example fault finding procedural sequence that may be utilized in locating possible fault locations. According to an example embodiment, the fault location engine (as in 102 of FIG. 1 or 200 of FIG. 2) may receive initial fault information 302 as part of a standard Event Context Message. According to an example embodiment, the fault information 302 may be passed by fault indicators to the fault locater sub-engine (as in 204 of FIG. 2), or by impedance to the impedance sub-engine (as in 206 of FIG. 2). In an example embodiment, when location is determined by fault indicators, the fault locater sub-engine (as in 204 of FIG. 2) may determine an initial fault indicator value to use. This value is usually provided as part of the fault information. If no such value is provided, a default value of 1 may be used. In an example embodiment, power network circuit may be traced downstream from the faulted device looking for a transition of fault indicator value between a switch and its neighboring switches. Only automatic switches are used for this since only automatic switches provide fault indicator measurements. According to an example embodiment, a fault location is bounded by (and therefore, can be determined by) an upstream switch with a fault indicator value of x and its neighboring downstream automatic switches with a fault indicator value different from x.

In an example embodiment, when a fault location is determined by impedance, the impedance sub-engine (as in 206 of FIG. 2) may receive a fault impedance value. In an example embodiment, the power network circuit may be traced downstream from the faulted device and the impedance value of all line segments traced may be subtracted from the received fault impedance value. When the resulting value becomes zero or negative, a possible fault is determined to exist within the current line. In an example embodiment, the difference between the resulting value and zero may be used to determine the distance to the fault within the given line (as a percentage). According to an example embodiment, whenever the circuit branches during the trace, the algorithm is executed within each branch. This may result in a multitude of potential faults. Each potential fault is added to the potential fault list.

According to an example embodiment, each location information object in the potential fault list may include switches bounding the potential fault location. In the case of a location found using fault indicators, the potential fault list may include only one upstream switch and zero or more downstream switches surrounding the faulted area. The potential fault list may also indicate how the fault location was determined, for example, by using fault indicators or impedance. In cases where locations are found using impedance, additional information in the list may include the identity of the faulted line segment and a percentage value within the line segment where the fault is thought to have occurred.

Figure 4:
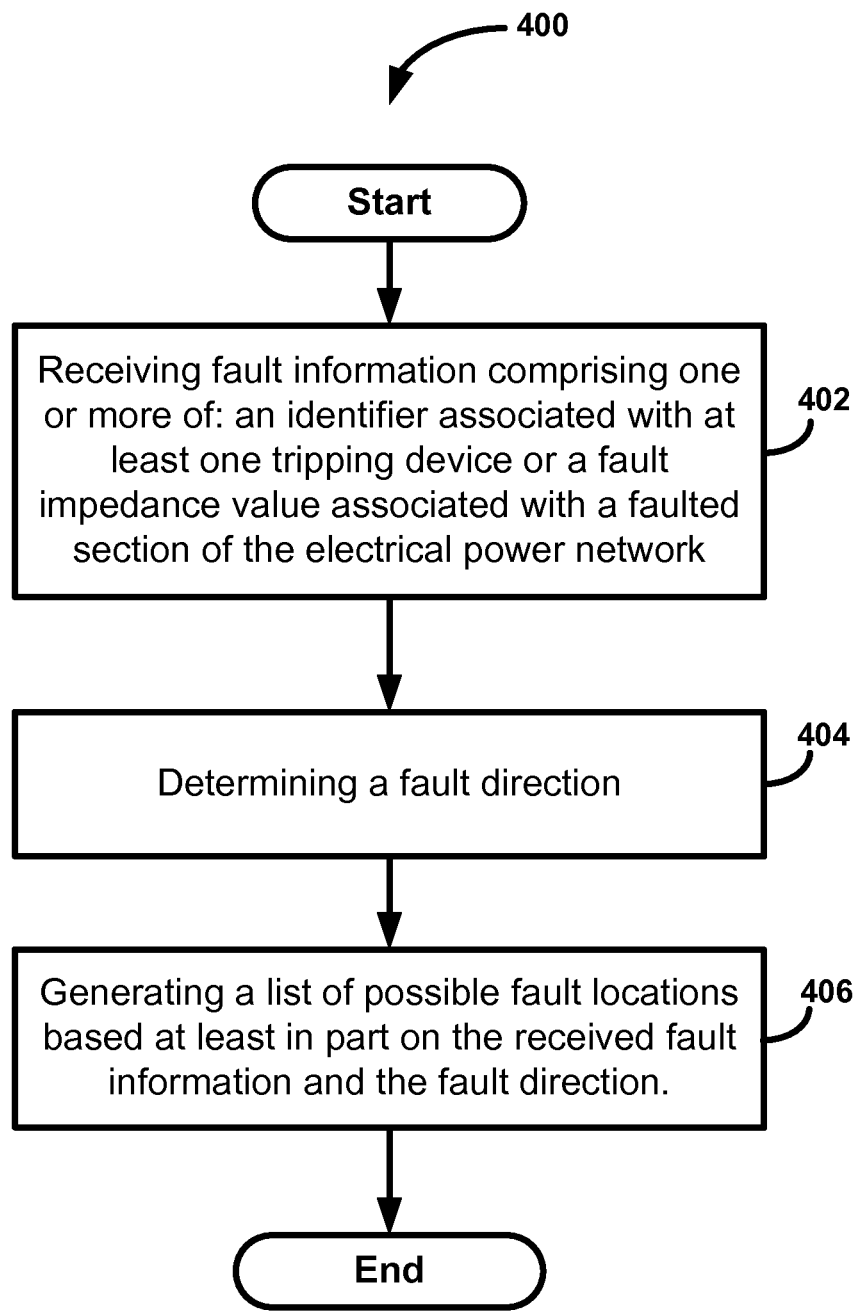
FIG. 4 is a flow diagram of an example method, according to an example embodiment of the invention.

An example method 400 for locating possible fault locations in an electrical power network will now be described with reference to the flowchart of FIG. 4. The method 400 starts in block 402, and according to an example embodiment of the invention, includes receiving fault information comprising one or more of: an identifier associated with at least one tripping device or a fault impedance value associated with a faulted section of the electrical power network. In block 404, the method 400 includes determining a fault direction. In block 406, the method 400 includes generating a list of possible fault locations based at least in part on the received fault information and the fault direction. The method 400 ends after block 406.

According to an example embodiment, the identifier associated with the at least one tripping device 126, 130 includes a fault indicator. According to an example embodiment, determining the fault direction includes receiving an energization flag attribute associated with the electrical power network 122. According to an example embodiment, determining the fault direction includes determining which side of the at least one tripping device 126, 130 is energized.

According to an example embodiment, generating the list 310 includes finding locations between an upstream switch having a fault indicator and one or more neighboring downstream automatic switches having a fault indicator that differs from the upstream switch fault indicator. According to an example embodiment, generating the list 310 includes tracing downstream from the at least one tripping device 126, 130 by a distance related to the fault impedance value. According to an example embodiment, generating the list may include tracing downstream within each branch from the at least one tripping device 126, 130 by a distance related to the fault impedance value.

According to example embodiments of the invention, a system and/or an apparatus may be provided. The system can include at least one tripping device 126, 130. The system and the apparatus can include a fault location engine 102 configured for receiving fault information 308. The fault information 308 can include one or more of an identifier associated with the at least one tripping device 126, 130 or a fault impedance value associated with a faulted section of an electrical power network 122. The fault location engine 102 may be configured for determining a fault direction and generating a list 310 of possible fault locations based at least in part on the received fault information 302 and the fault direction. According to an example embodiment, the identifier associated with the at least one tripping device 126, 130 can include a fault indicator.

In an example embodiment, the fault location engine 102 is configured for determining the fault direction based at least in part on receiving an energization flag attribute associated with the electrical power network 122. In an example embodiment, the fault location engine 102 is configured for determining the fault direction based at least in part on receiving energy measurements to determine which side of the at least one tripping device 126, 130 is energized. In an example embodiment, the fault location engine 102 is configured for generating the list 310 based at least in part on finding locations between an upstream switch having a fault indicator and one or more neighboring downstream automatic switches having a fault indicator that differs from the upstream switch fault indicator. In an example embodiment, the fault location engine 102 is configured for generating the list 310 based at least in part on tracing downstream from the at least one tripping device 126, 130 by a distance related to the fault impedance value. In an example embodiment, the fault location engine 102 is configured for generating the list 310 based at least in part on tracing downstream within each branch from the at least one tripping device 126, 130 by a distance related to the fault impedance value.

According to example embodiments, certain technical effects can be provided, such as creating certain systems, methods, and apparatus that provide fault location alternatives that allow power companies to make quick and informed decisions involving the restoration of electric power to their customers. Example embodiments of the invention can provide the further technical effects of providing systems, methods, and apparatus for implementing automatic isolation and restoration capabilities whenever a single fault location is determined to exist.

In example embodiments of the invention, the fault location system 100 may include any number of hardware and/or software applications that are executed to facilitate any of the operations.

In example embodiments, one or more I/O interfaces may facilitate communication between the fault location system 100 and one or more input/output devices. For example, a universal serial bus port, a serial port, a disk drive, a CD-ROM drive, and/or one or more user interface devices, such as a display, keyboard, keypad, mouse, control panel, touch screen display, microphone, etc., may facilitate user interaction with the fault location system 100. The one or more I/O interfaces may be utilized to receive or collect data and/or user instructions from a wide variety of input devices. Received data may be processed by one or more computer processors as desired in various embodiments of the invention and/or stored in one or more memory devices.

One or more network interfaces may facilitate connection of the fault location system 100 inputs and outputs to one or more suitable networks and/or connections; for example, the connections that facilitate communication with any number of sensors associated with the system. The one or more network interfaces may further facilitate connection to one or more suitable networks; for example, a local area network, a wide area network, the Internet, a cellular network, a radio frequency network, a Bluetooth™ (owned by Telefonaktiebolaget LM Ericsson) enabled network, a Wi-Fi™ (owned by Wi-Fi Alliance) enabled network, a satellite-based network, any wired network, any wireless network, etc., for communication with external devices and/or systems.

As desired, embodiments of the invention may include the fault location system 100, the fault location engine 102, or the fault location engine 200 with more or less of the components illustrated in FIGS. 1 and 2.

Certain embodiments of the invention are described above with reference to block and flow diagrams of systems, methods, apparatuses, and/or computer program products according to example embodiments of the invention. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the invention.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the invention may provide for a computer program product, comprising a computer-usable medium having a computer-readable program code or program instructions embodied therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

While certain embodiments of the invention have been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the invention, including the best mode, and also to enable any person skilled in the art to practice certain embodiments of the invention, including making and using any devices or systems and performing any incorporated methods. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A method for locating possible fault locations in an electrical power network, the method comprising:
   receiving fault information comprising an identifier associated with at least one tripping device and a fault impedance value associated with a faulted section of the electrical power network;
   determining a fault direction;
   generating a list of possible fault locations based on the received fault information and the fault direction, wherein the list of possible fault locations comprises a location of one or more line segments and a percentage value within each of the one or more line segments where a fault may have occurred; and
   determining an exact location of one or more actual faults based on the list of possible fault locations, the location of the one or more line segments, and the percentage value within each of the one or more line segments.

2. The method of claim 1, wherein the identifier associated with the at least one tripping device comprises a fault indicator.

3. The method of claim 1, wherein determining the fault direction comprises receiving an energization flag attribute associated with the electrical power network.

4. The method of claim 1, wherein determining the fault direction comprises determining which side of the at least one tripping device is energized based at least in part on energy measurements associated with an energization flag attribute.

5. The method of claim 1, wherein generating the list comprises finding locations between an upstream switch having a fault indicator and one or more neighboring downstream automatic switches having a fault indicator that differs from the upstream switch fault indicator.

6. The method of claim 1, wherein generating the list comprises tracing downstream from the at least one tripping device by a distance related to the fault impedance value.

7. The method of claim 6, further comprising tracing downstream within each branch from the at least one tripping device by a distance related to the fault impedance value.

8. A system comprising:
   at least one tripping device;
   a fault location engine configured for receiving fault information comprising an identifier associated with the at least one tripping device and a fault impedance value associated with a faulted section of an electrical power network;
   determining a fault direction;
   generating a list of possible fault locations based on the received fault information and the fault direction, wherein the list of possible fault locations comprises a location of one or more line segments and a percentage value within each of the one or more line segments where a fault may have occurred; and
   determining an exact location of one or more actual faults based on the list of possible fault locations, the location of the one or more line segments, and the percentage value within each of the one or more line segments.

9. The system of claim 8, wherein the identifier associated with the at least one tripping device comprises a fault indicator.

10. The system of claim 8, wherein the fault location engine is configured for determining the fault direction based at least in part on receiving an energization flag attribute associated with the electrical power network.

11. The system of claim 8, wherein the fault location engine is configured for determining the fault direction based at least in part on receiving energy measurements to determine which side of the at least one tripping device is energized.

12. The system of claim 8, wherein the fault location engine is configured for generating the list based at least in part on finding locations between an upstream switch having a fault indicator and one or more neighboring downstream automatic switches having a fault indicator that differs from the upstream switch fault indicator.

13. The system of claim 8, wherein the fault location engine is configured for generating the list based at least in part on tracing downstream from the at least one tripping device by a distance related to the fault impedance value.

14. The system of claim 8, wherein the fault location engine is configured for generating the list based at least in part on tracing downstream within each branch from the at least one tripping device by a distance related to the fault impedance value.

15. An apparatus comprising:
a fault location engine configured for:
receiving fault information comprising an identifier associated with at least one tripping device and a fault impedance value associated with a faulted section of an electrical power network;
determining a fault direction;
generating a list of possible fault locations based on the received fault information and the fault direction, wherein the list of possible fault locations comprises a location of one or more line segments and a percentage value within each of the one or more line segments where a fault may have occurred; and
determining an exact location of one or more actual faults based on the list of possible fault locations, the location of the one or more line segments, and the percentage value within each of the one or more line segments.

16. The apparatus of claim 15, wherein the identifier associated with the at least one tripping device comprises a fault indicator.

17. The apparatus of claim 15, wherein the fault location engine is configured for determining the fault direction based at least in part on receiving an energization flag attribute associated with the electrical power network.

18. The apparatus of claim 15, wherein the fault location engine is configured for determining the fault direction based at least in part on receiving energy measurements to determine which side of the at least one tripping device is energized.

19. The apparatus of claim 15, wherein the fault location engine is configured for generating the list based at least in part on finding locations between an upstream switch having a fault indicator and one or more neighboring downstream automatic switches having a fault indicator that differs from the upstream switch fault indicator.

20. The apparatus of claim 15, wherein the fault location engine is configured for generating the list based at least in part on tracing downstream within each branch from the at least one tripping device by a distance related to the fault impedance value.

* * * * *